(12) United States Patent
Xie et al.

(10) Patent No.: US 12,341,129 B2
(45) Date of Patent: Jun. 24, 2025

(54) SUBSTRATELESS DOUBLE-SIDED EMBEDDED MULTI-DIE INTERCONNECT BRIDGE

(71) Applicant: Intel Corporation, Santa Clara, CA (US)

(72) Inventors: Biancun Xie, Chandler, AZ (US); Jianyong Xie, Chandler, AZ (US); Sujit Sharan, Chandler, AZ (US); Debendra Mallik, Chandler, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1067 days.

(21) Appl. No.: 16/440,218

(22) Filed: Jun. 13, 2019

(65) Prior Publication Data

US 2020/0395300 A1 Dec. 17, 2020

(51) Int. Cl.
*H01L 25/065* (2023.01)
*H01L 23/00* (2006.01)
*H01L 23/538* (2006.01)
*H01L 23/498* (2006.01)
*H01L 23/64* (2006.01)

(52) U.S. Cl.
CPC ...... *H01L 25/0655* (2013.01); *H01L 23/5383* (2013.01); *H01L 23/5384* (2013.01); *H01L 23/5385* (2013.01); *H01L 23/5386* (2013.01); *H01L 24/16* (2013.01); *H01L 23/49816* (2013.01); *H01L 23/642* (2013.01); *H01L 2224/16227* (2013.01)

(58) Field of Classification Search
CPC ............ H01L 23/5385; H01L 23/5381; H01L 23/5383; H01L 23/5386; H01L 25/0655
See application file for complete search history.

(56) References Cited

U.S. PATENT DOCUMENTS

| 6,737,750 | B1 * | 5/2004 | Hoffman | H01L 23/552 |
| | | | | 257/777 |
| 8,901,748 | B2 | 12/2014 | Manusharow et al. | |
| 9,147,663 | B2 * | 9/2015 | Liu | H01L 23/53238 |
| 9,275,955 | B2 | 3/2016 | Mahajan et al. | |
| 9,368,450 | B1 * | 6/2016 | Gu | H01L 23/5385 |
| 9,418,965 | B1 * | 8/2016 | Li | H01L 21/4857 |
| 9,852,994 | B2 * | 12/2017 | Haba | H01L 23/5386 |
| 2014/0070380 | A1 * | 3/2014 | Chiu | H01L 23/5381 |
| | | | | 438/107 |
| 2014/0299999 | A1 * | 10/2014 | Hu | H01L 21/561 |
| | | | | 257/774 |

(Continued)

*Primary Examiner* — Lauren R Bell
(74) *Attorney, Agent, or Firm* — Schwabe, Williamson & Wyatt P.C.

(57) ABSTRACT

Microelectronic assemblies, related devices, and methods are disclosed herein. In some embodiments, a microelectronic assembly including a substrate having a conductive plane; and a bridge having first contacts at a first surface and second contacts at an opposing second surface, wherein the bridge is embedded in the substrate and coupled to the conductive plane in the substrate via the first contacts, wherein the bridge is coupled to a first die and a second die via the second contacts, and wherein the bridge does not include a silicon substrate.

20 Claims, 9 Drawing Sheets

(56) References Cited

U.S. PATENT DOCUMENTS

| | | | |
|---|---|---|---|
| 2015/0279777 A1* | 10/2015 | Hsu | H01L 23/562 |
| | | | 29/850 |
| 2016/0300796 A1* | 10/2016 | Karhade | H01L 25/0657 |
| 2017/0040264 A1* | 2/2017 | Qian | H01L 23/5386 |
| 2018/0174972 A1* | 6/2018 | Weng | H01L 23/552 |
| 2018/0240778 A1* | 8/2018 | Liu | H01L 23/5383 |
| 2018/0331042 A1* | 11/2018 | Manusharow | H01L 21/4857 |
| 2018/0374788 A1* | 12/2018 | Nakagawa | H01L 25/18 |
| 2019/0304911 A1* | 10/2019 | Collins | H01L 21/4853 |

* cited by examiner

SUBSTRATELESS DOUBLE-SIDED EMBEDDED MULTI-DIE INTERCONNECT BRIDGE

BACKGROUND

Integrated circuit (IC) packages may include an embedded multi-die interconnect bridge (EMIB) with a substrate on a first surface and conductive contacts on an opposing second surface for coupling two or more IC dies. Typically, IC packages including an EMIB for managing power delivery to IC dies have a power supply path that is non-vertical and flows around the embedded EMIB.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
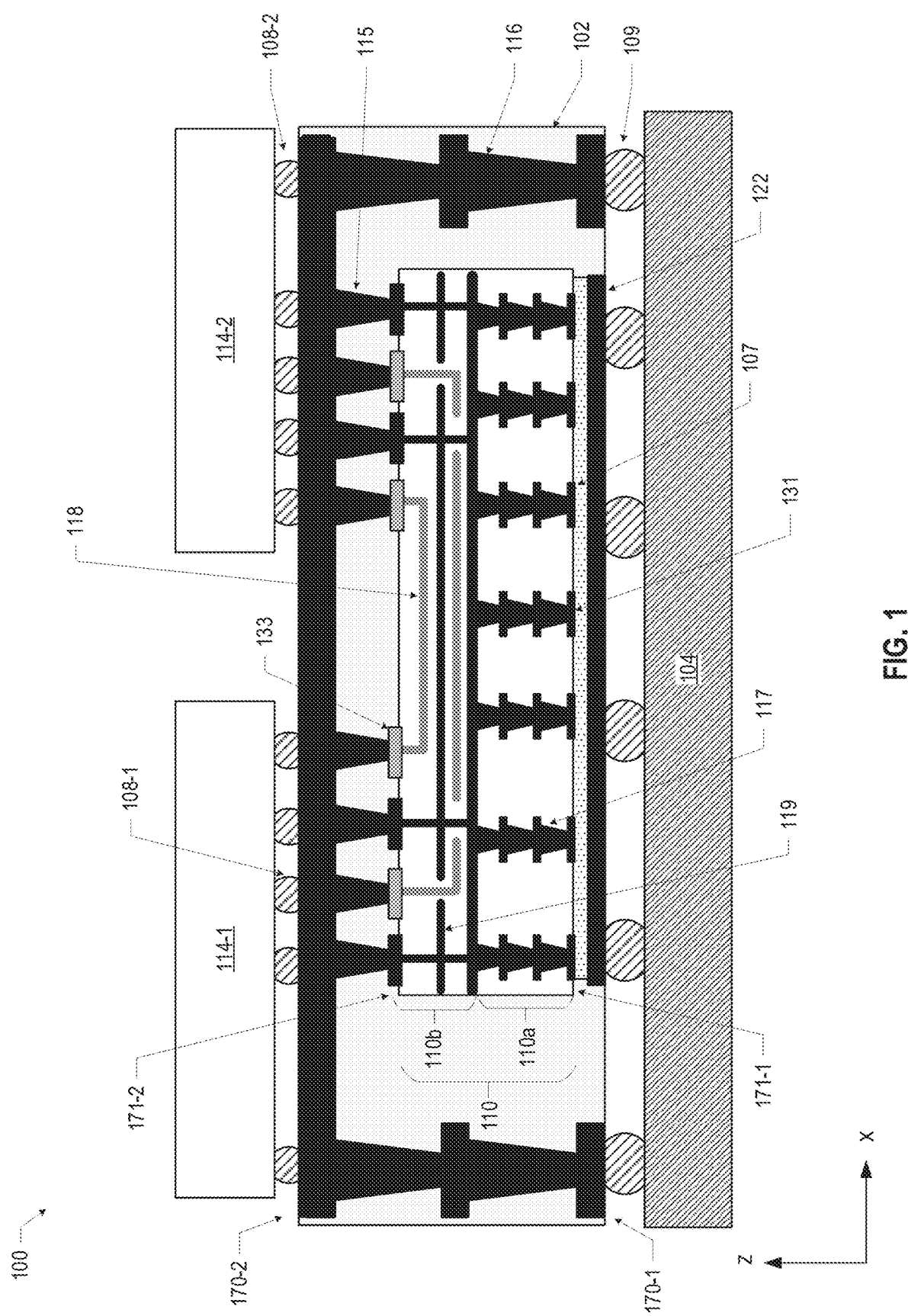
FIG. 1 is a side, cross-sectional view of an example microelectronic assembly, in accordance with various embodiments.

Disclosed herein are microelectronic assemblies including a substrateless, double-sided EMIB having vertical power supply pathways, as well as related apparatuses and methods. For example, in some embodiments, a microelectronic assembly, including a substrate having a conductive plane; a bridge having first contacts at a first surface and second contacts at an opposing second surface, and a plurality of vertically stacked vias between an individual first contact and an individual second contact, wherein the bridge is embedded in the substrate and coupled to the conductive plane in the substrate by the first contacts; a first die coupled to two or more second contacts at the second surface of the bridge, wherein the first die is coupled to the conductive plane in the substrate by the plurality of vertically stacked vias; and a second die coupled to one or more second contacts at the second surface of the bridge, wherein the second die is coupled to the first die by the second contacts and conductive pathways in the bridge. In some embodiments, a microelectronic assembly including a substrate having a conductive plane; and a bridge having first contacts at a first surface and second contacts at an opposing second surface, wherein the bridge is embedded in the substrate and coupled to the conductive plane in the substrate via the first contacts, wherein the bridge is coupled to a first die and a second die via the second contacts, and wherein the bridge does not include silicon.

The drive for miniaturization of IC devices has created a similar drive to provide dense interconnections between dies in a package assembly. For example, interconnect bridges, such as an EMIB architecture, are emerging to provide dense interconnect routing between dies or other electrical components. To increase the functionality of a package substrate, an interconnect bridge may be embedded in the package substrate to route signals between one or more dies arranged laterally along a same plane. Such bridges may take advantage of semiconductor processing techniques to form dense interconnect routing features. Typically, an EMIB includes a substrate portion (e.g., a carrier) without conductive features for mechanical support and a routing portion on the substrate portion with the interconnect routing features that are coupled to the one or more dies. Traditionally, an EMIB has limited power delivery capability as compared to other interposer technologies as the power delivery path is non-vertical (e.g., current path flows around the EMIB in the package substrate).

Various ones of the embodiments disclosed herein provide power delivery structures for improved IC package functionality that may be fabricated directly into an EMIB. Additionally, various ones of the embodiments disclosed herein apply existing semiconductor processing techniques to fabricate a double-sided, substrateless EMIB having vertical power delivery structures. The processes disclosed herein may be used to integrate vertical power structures directly into an EMIB, which may provide for improved power delivery and may lower assembly costs. Relative to the higher cost of forming through-silicon vias and other conductive structures directly in silicon, various ones of the embodiments disclosed herein may enable vertical power structures to be formed inexpensively in a non-silicon EMIB (e.g., an EMIB without a silicon substrate portion). Such embodiments may be particularly advantageous in low-cost computing applications, system-in-package applications, and server applications (which have a high demand for power delivery). The embodiments disclosed herein may achieve improved functionality of IC packages by providing more direct power delivery routing through an EMIB and reduced dimensions of the packages by putting vertical power structures in otherwise unavailable real estate (e.g., within an EMIB rather than conventional power delivery routing in the package substrate and around the EMIB). This improvement in computing density may enable new form factors for wearable computing devices and system-in-package applications in which package dimensions are constrained.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," "with," and the like, as used with respect to embodiments of the present disclosure, are synonymous. As used herein, a "package" and an "IC package" are synonymous, as are a "die" and an "IC die." As used herein, the terms "bridge," "interconnect bridge," "EMIB," and "interposer" may be used interchangeably. The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct connection, such as a direct electrical, mechanical, or magnetic connection between the things that are connected, or an indirect connection, through one or more passive or active intermediary devices. The meaning of "a," "an," and "the" include plural references. The meaning of "in" includes "in" and "on."

When used to describe a range of dimensions, the phrase "between X and Y" represents a range that includes X and Y. For convenience, the phrase "FIG. 4" may be used to refer to the collection of drawings of FIGS. 4A-4D, the phrase "FIG. 6" may be used to refer to the collection of drawings of FIGS. 6A-6C, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a cross-sectional side view of an example substrateless microelectronic assembly 100 including a package substrate 102, a bridge 110 embedded in the package substrate 102, and multiple dies 114 disposed thereon. As shown in FIG. 1, an x-dimension is width and a z-dimension is thickness. The package substrate 102 may have a first surface 170-1 and an opposing second surface 170-2. The bridge 110 may include a first surface 171-1 having first contacts 131 and a second surface 171-2 having second contacts 133, such that the bridge 110 is double-sided. For example, the bridge 110 may be coupled to the package substrate 102 at the first surface 171-1 via the first contacts 131 and at the second surface 171-2 via the second contacts 133. As used herein, the term "double-sided bridge" refers to a bridge that has connections on both surfaces coupled by conductive pathways through the bridge but does not include a bridge having through-silicon vias as the conductive pathways to form the connections on both surfaces.

The bridge 110 may include a first portion 110a and a second portion 110b, where the first and second portions 110a, 110b have conductive structures through an insulating material. In some embodiments, the bridge 110 may include dielectric layers that alternate with conductive layers. The first portion 110a may include one or more stacked bridge vias (SBVs) 117. The SBVs 117 may be arranged vertically (e.g., stacked on top of another) such that a centerpoint of a lower SBV aligns with a centerpoint of an upper SBV. The SBVs 117 may extend through the first portion 110a (e.g., from the first surface 171-1 of the bridge 110 to the second portion 110b). The second portion 110b may include high-density conductive pathways 118 (e.g., traces and/or vias) for routing electrical signals (e.g., as depicted by the gray lines) between the dies 114-1, 114-2, and one or more conductive planes 119 (e.g., power plane or ground plane where the conductive plane is coupled to a power source or a ground source, respectively) for providing power (e.g., as depicted by the horizontal black lines) to the dies 114-1, 114-2. The plurality of conductive planes may be coupled by vias (e.g., as depicted by the vertical black lines). The conductive plane 119 in the second portion 110b may be coupled to a conductive plane 122 in the package substrate 102 via the plurality of SBVs 117 in the first portion 110a to provide vertical power delivery pathways from the package substrate 102 to the dies 114-1, 114-2. As used herein, the terms "conductive plane," "power plane," "ground plane," and "power/ground plane" may be used interchangeably. In some embodiments, the power/ground plane 122 in the package substrate 102 may be coupled to the first contacts 131 in the bridge 110 by a conductive adhesive 107, such as an anisotropic conductive film. In some embodiments, the power/ground plane 122 in the package substrate 102 may be coupled to the first contacts 131 in the bridge 110 by conductive pillars, solder, or by any other suitable means.

The bridge 110 may be made of any suitable non-silicon, insulating material. For example, in some embodiments, the insulating material may include a dielectric material, such as silicon dioxide, silicon nitride, oxynitride, polyimide materials, glass reinforced epoxy matrix materials, or a low-k or ultra low-k dielectric (e.g., organo-silicate glass (OSG), silicon oxycarbide (SiOC), carbon-doped dielectrics, fluorine-doped dielectrics, porous dielectrics, organic polymeric dielectrics, photo-imageable dielectrics, and/or benzocyclobutene-based polymers). Although the term "insulating material" is used herein, different layers of the insulating material in a bridge 110 may be formed of different materials.

The conductive structures (e.g., SBVs 117, conductive pathways 118, and conductive planes 119) in the bridge 110 may be made of any suitable conductive material, including, for example, a metal, such as copper or aluminum, or a metal alloy. The conductive structures in the bridge 110 (e.g., SBVs 117, conductive pathways 118, and conductive planes 119) may be integrated in the bridge 110 during manufacturing. The conductive structures (e.g., SBVs 117, conductive pathways 118, and conductive planes 119) may be formed on a removable carrier (as shown in FIG. 4) using, for example, semiconductor manufacturing techniques. In some embodiments, the conductive structures (e.g., SBVs 117, conductive pathways 118, and conductive planes 119) may be formed using complementary metal oxide semiconductor (CMOS) fabrication techniques such as thin film deposition, etch, and/or lithography processes. The techniques may be similar to those used to fabricate back-end interconnect routing on a die. Although FIG. 1 shows a particular arrangement of SBVs 117, conductive pathways 118, and conductive planes 119, a bridge 110 may have any suitable arrangement of conductive structures 117, 118, 119, as desired.

In some embodiments, the conductive structures (e.g., SBVs 117) in the first portion 110a may have greater dimensions as compared to the conductive structures (e.g., conductive pathways 118 and conductive planes 119) in the second portion 110b. For example, in some embodiments, an individual SBV 117 in the first portion 110a may have a thickness between 3 microns (um) and 5 um, and an individual conductive pathway 118 or an individual conductive plane 119 in the second portion 110b may have a thickness between 0.5 um and 2 um. In some embodiments, an individual SBV 117 in the first portion 110a may have a width between 2 um and 6 um, and an individual via (e.g., a vertical pathway through a dielectric layer) in the second portion 110b may have a width between 0.5 um and 3 um.

The dies 114 may be coupled to the second surface 170-2 of the package substrate 102 via first level interconnects 108-1, 108-2, as illustrated. The dies 114-1, 114-2 may be coupled to the second contacts 133 on the second surface 171-2 of the bridge 110 via the first level interconnects 108 and conductive pillars 115, or solder joints, in the package substrate 102. In some embodiments, the first level interconnects 108 may include solder bumps or balls (as illustrated in FIG. 1); in other embodiments, the first level interconnects 108 may include wirebonds or any other suitable interconnect. In some embodiments, the bridge 110 may be wholly embedded (as shown in FIG. 1) in the package substrate 102 such that the bridge 110 is wholly surrounded by the package substrate 102. In some embodiments, the second surface 171-2 of the bridge 110 may be flush with the second surface 170-2 of the package substrate 102 (not shown), such that the dies 114 may be coupled to the second contacts 133 on the second surface 171-2 of the bridge 110 via first level interconnects 108. Although two dies 114 are illustrated in FIG. 1, this is simply an example, and the microelectronic assembly 100 may include one or more dies 114. The dies 114 may perform any suitable functionality, and may include processing devices, memory, communications devices, sensors, or any other computing components or circuitry. For example, the die 114 may be a central processing unit (CPU), a graphics processing unit (GPU), an application-specific integrated circuit (ASIC), a programmable logic device (PLD), or any other desired processor or logic device. A memory die, for example, may be an erasable-programmable read-only memory (EPROM) chip, a non-volatile memory (e.g., 3D XPoint) chip, a volatile memory (e.g., high bandwidth memory) chip, or any other suitable memory device. In some embodiments, one of the dies 114-1 may be a PLD and the other die 114-2 may be a GPU. In some embodiments, the die 114-1 may be a CPU and the die 114-2 may be a memory die. In some embodiments, an underfill material (not shown) may be disposed between the dies 114 and the second surface 170-2 of the package substrate 102. In some embodiments, an overmold material (not shown) may be disposed around the dies 114 and in contact with the second surface 170-2 of the package substrate 102.

The dies 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). Example structures that may be included in the dies 114 disclosed herein are discussed below with reference to FIG. 11. The conductive pathways in the dies 114 may be bordered by liner materials, such as adhesion liners and/or barrier liners, as suitable.

The package substrate 102 may further include conductive pathways 116 through an insulating material. The conductive pathways 116 may couple the dies 114 to a circuit board 104 (e.g., via the first level interconnects 108 and second level interconnects 109). Any suitable arrangement of conductive pathways through any suitable number of insulating layers forming the insulating material may couple the dies 114 to each other and/or to other components (not shown) and the dies 114 to the circuit board 104, as desired. The package substrate 102 may be an organic substrate. For example, in some embodiments, the insulating material may be an organic material, such as an epoxy-based laminate. The insulating material may be, for example, a build-up film (e.g., Ajinomoto build-up film). The insulating material may include, for example, an epoxy with a phenolic hardener. The conductive pathways may be made of any suitable conductive material, for example, copper. Although FIG. 1 shows a single bridge 110 with two dies 114, a package substrate 102 may include any suitable number and arrangement of bridges 110 and dies 114.

The package substrate 102 may be coupled to the circuit board 104 via second level interconnects 109 at the first surface 170-1 of the package substrate 102. In some embodiments, the second level interconnects 109 may include solder balls (as illustrated in FIG. 1) for a ball grid array (BGA) coupling; in other embodiments, the second level interconnects 109 may include solder paste contacts to provide land grid array (LGA) interconnects, or any other suitable interconnect. The circuit board 104 may include conductive pathways (not shown) that allow power, ground, and other electrical signals to move between the circuit board 104 and the package substrate 102, as known in the art. Although FIG. 1 illustrates a single package substrate 102 disposed on the circuit board 104, this is simply for ease of illustration and multiple package substrates 102 having one or more dies 114 (i.e., IC packages) may be disposed on the circuit board 104. In some embodiments, the circuit board 104 may be a printed circuit board (PCB) (e.g., a motherboard). In some embodiments, the circuit board 104 may be another IC package, and the microelectronic assembly 100 may be a package-on-package structure. In some embodiments, the circuit board 104 may be an interposer, and the microelectronic assembly 100 may be a package-on-interposer structure.

A number of elements are illustrated in FIG. 1, but a number of these elements may not be present in microelectronic assemblies disclosed herein. For example, in various embodiments, the conductive pillars 115, the conductive pathways 116, the second level interconnects 109, and/or the circuit board 104 may not be included. Further, FIG. 1 illustrates a number of elements that are omitted from subsequent drawings for ease of illustration, but may be included in any of the microelectronic assemblies disclosed herein. Examples of such elements include the second level interconnects 109 and/or the circuit board 104. Many of the elements of the microelectronic assembly 100 of FIG. 1 are included in other ones of the accompanying figures; the discussion of these elements is not repeated when discussing these figures, and any of these elements may take any of the forms disclosed herein. A number of elements are not illustrated in FIG. 1, but may be present in microelectronic subassemblies disclosed herein; for example, additional active components, such as additional dies, or additional passive components, such as resistors, capacitors, and/or inductors, may be disposed on the top surface or the bottom surface of the package substrate 102, or embedded in the package substrate 102, and may be electrically connected by the conductive pathways in the package substrate 102.

Figure 2:
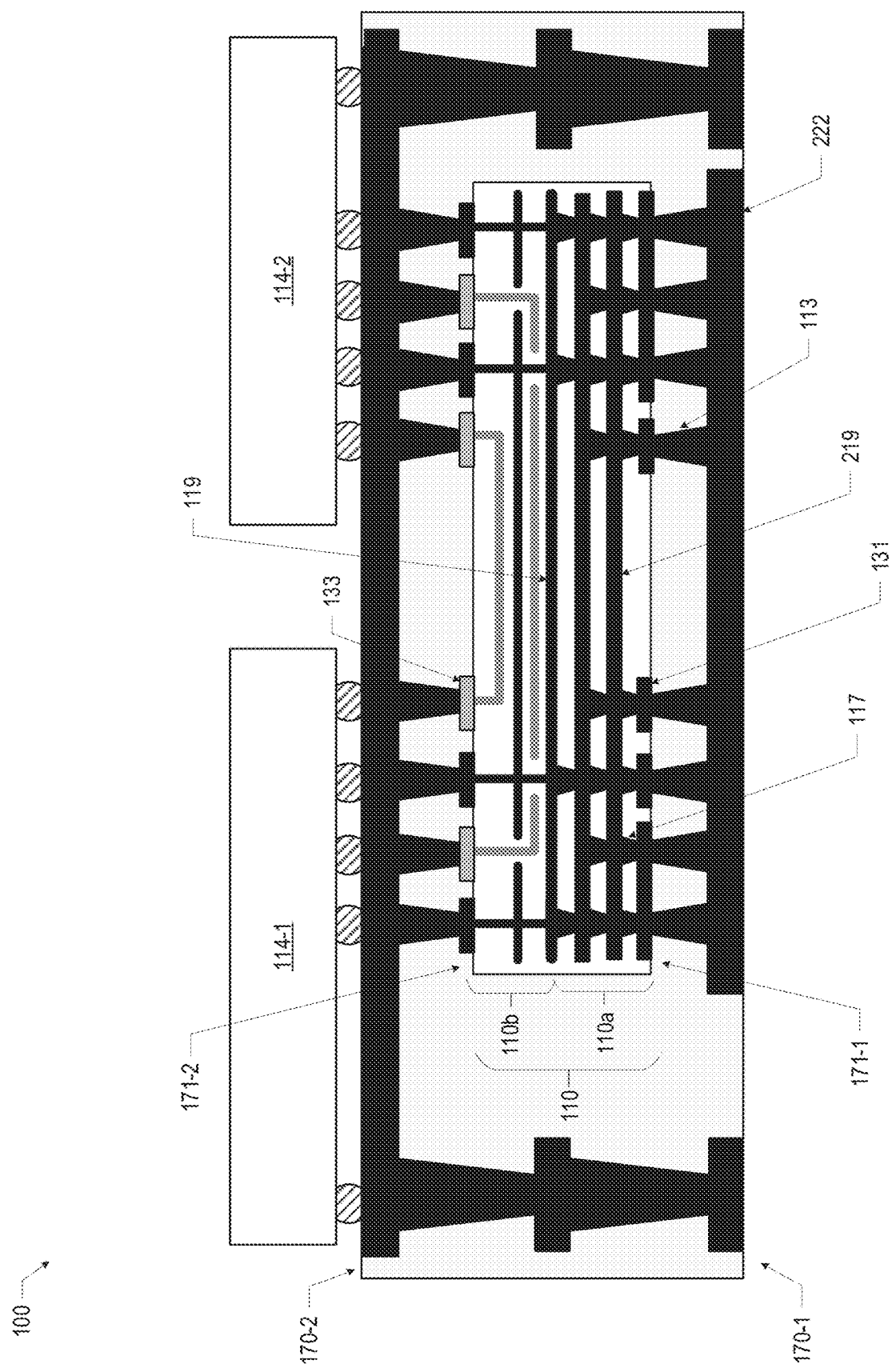
FIG. 2 is a side, cross-sectional view of an example microelectronic assembly, in accordance with various embodiments.

FIG. 2 is a cross-sectional side view of an example microelectronic assembly 100 including a package substrate 102, a bridge 110 embedded in the package substrate 102, and multiple dies 114 disposed thereon. The bridge 110 may include a first surface 171-1 having first contacts 131 and a second surface 171-2 having second contacts 133, such that the bridge 110 is double-sided. The bridge 110 may include a first portion 110a and a second portion 110b, where the first and second portions 110a, 110b have conductive structures through an insulating material. The first portion 110a may include one or more SBVs 117 and one or more power/ground planes 219. The SBVs 117 may extend through the first portion 110a (e.g., from the first surface 171-1 of the bridge 110 to the second portion 110b) to couple one or more power/ground planes 219. The one or more power/ground planes 219 in the first portion 110a may be coupled to a power/ground plane 222 in the package substrate 102 via the first contacts 131 and conductive pillars 113, and may be coupled to the one or more ground and/or power planes 119 in the second portion 110b to provide vertical power delivery pathways from the package substrate 102 to the dies 114-1, 114-2.

FIG. 2 is a cross-sectional side view of an example substrateless microelectronic assembly 100 including a package substrate 102, a bridge 110 embedded in the package substrate 102, and multiple dies 114 disposed thereon. The bridge 110 may include a first surface 171-1 having first contacts 131 and a second surface 171-2 having second contacts 133, such that the bridge 110 is double-sided. The bridge 110 may include a first portion 110a and a second portion 110b, where the first and second portions 110a, 110b have conductive structures through an insulating material. The first portion 110a may include one or more SBVs 117 and one or more power/ground planes 219. The SBVs 117 may extend through the first portion 110a (e.g., from the first surface 171-1 of the bridge 110 to the second portion 110b) and may couple to one or more power/ground planes 219. The second portion 110b may include high-density conductive pathways 118 and one or more ground and/or power planes 119 as described above with reference to FIG. 1. The power/ground plane 219 in the first portion 110a may be coupled to a power/ground plane 222 in the package substrate 102 via the first contacts 131 and conductive pillars 113, and may be coupled to the one or more ground and/or power planes 119 in the second portion 110b to provide vertical power delivery pathways from the package substrate 102 to the dies 114-1, 114-2. The power/ground plane 219 in the first portion may be formed using any suitable technique, including semiconductor manufacturing techniques as described above with reference to FIG. 1, and may have a thickness between 2 um and 5 um.

Figure 3:
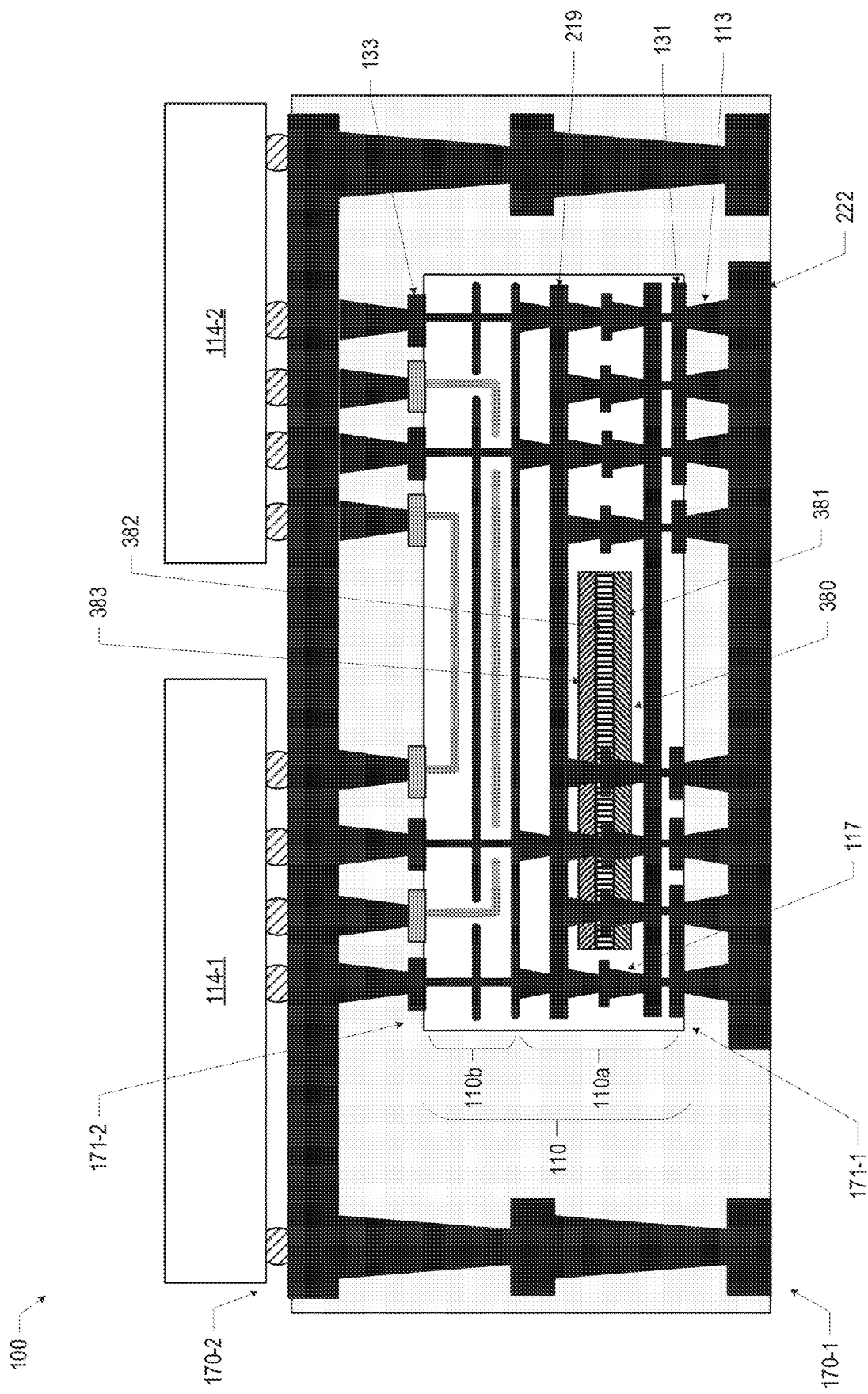
FIG. 3 is a side, cross-sectional view of an example microelectronic assembly, in accordance with various embodiments.

FIG. 3 is a cross-sectional side view of an example substrateless microelectronic assembly 100 including a package substrate 102, a bridge 110 with an integrated capacitor embedded in the package substrate 102, and multiple dies 114 disposed thereon. The bridge 110 may include a first portion 110a having one or more SBVs 117, one or more power/ground planes 219, and a capacitor 380 integrated across the power/ground planes 219. An integrated capacitor 380 may improve the performance of the microelectronic assembly 100 by supplying an increased total capacitance, without increasing the capacitance in the dies 114, and by delivering power via the vertical power paths in the bridge 110. The capacitor 380 may be any suitable capacitor, including, as shown in FIG. 3, a metal-insulator-metal (MIM) capacitor, having a dielectric layer 382 between a first metal layer 381 (i.e., a bottom electrode) and a second metal layer 383 (i.e., a top electrode). The capacitor 380 may be formed of any suitable insulator material, such as silicon dioxide or a high-k dielectric material, and any suitable metal material, such as copper or aluminum. In some embodiments, the capacitor 380 may be formed using the same materials that are used to form the bridge 110. In some embodiments, the capacitor 380 may be formed using different materials from those used to form the bridge 110. The capacitor 380 may be formed using any suitable process, including semiconductor manufacturing techniques, as described above with reference to FIG. 1. In some embodiments, a first thickness of the first metal layer 381 may be equal to a second thickness of the second metal layer 383 (e.g., the first and second metal layers have a same thickness). In some embodiments, a first thickness of the first metal layer 381 may be different from a second thickness of the second metal layer 383.

Any suitable techniques may be used to manufacture microelectronic assemblies having a double-sided, substrateless bridge disclosed herein. For example, FIGS. 4A-4D are side, cross-sectional views of various stages in an example process for manufacturing the bridge 110 of FIG. 1, in accordance with various embodiments. Although the operations discussed below with respect to FIGS. 4A-4D are illustrated in a particular order, these operations may be performed in any suitable order. Additionally, although particular assemblies are illustrated in FIGS. 4A-4D, the operations discussed below with reference to FIGS. 4A-4D may be used to form any bridge 110 disclosed herein.

Figure 4A:
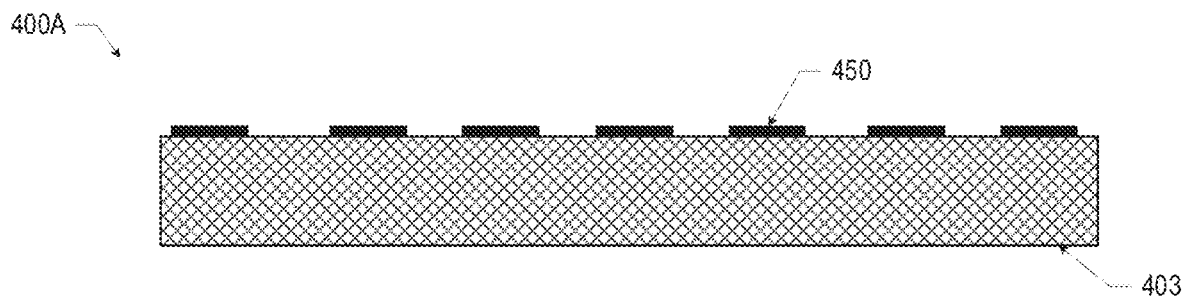
FIGS. 4A-4D are side, cross-sectional views of various stages in an example process for manufacturing a microelectronic assembly, in accordance with various embodiments.

FIG. 4A illustrates an assembly 400A including a carrier 403, also referred to herein as a substrate or silicon substrate, subsequent to depositing a first conductive layer 450 on the carrier 403. The first conductive layer 450 may be formed by depositing conductive material using any suitable technique, including CMOS fabrication techniques. The first conductive layer 450 may be any suitable conductive material, including copper or aluminum. The carrier 403 may be of any suitable material, such as silicon, and may be attached to the subassembly using any suitable means that may allow for removal at the end of the process.

Figure 4B:
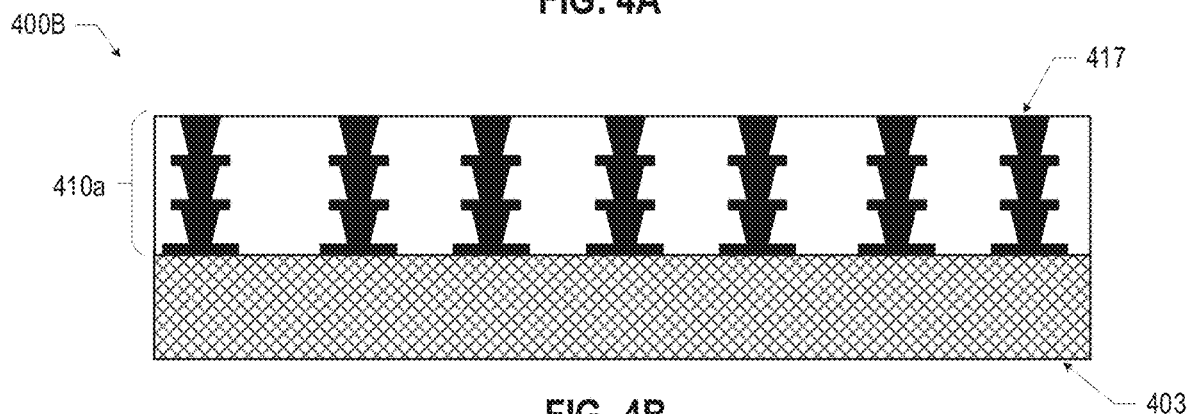
Figure 7:
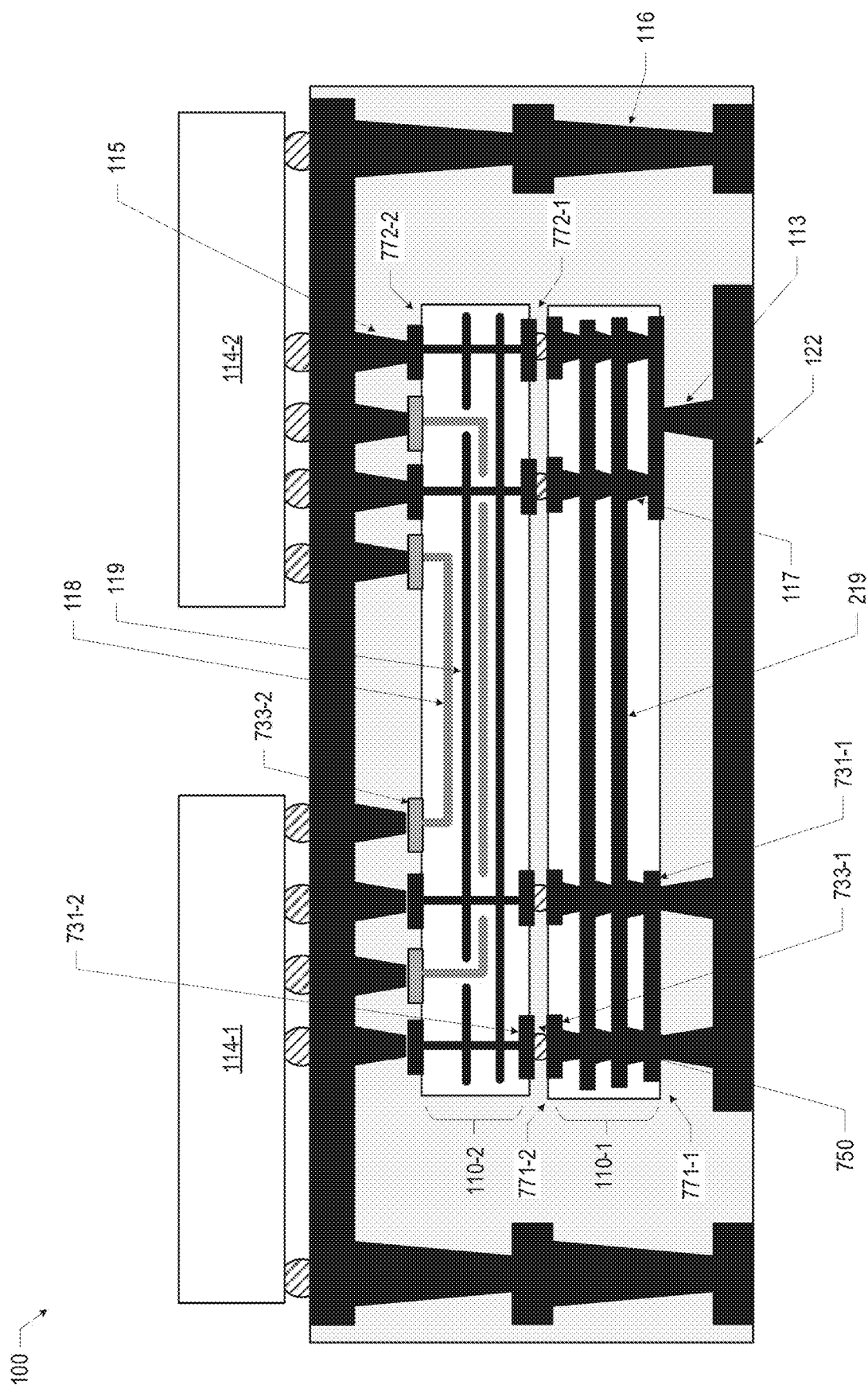
FIG. 7 is a side, cross-sectional view of an example microelectronic assembly, in accordance with various embodiments.

FIG. 4B illustrates an assembly 400B including the assembly 400A subsequent to forming a first portion 410a of a bridge including a plurality of SBVs 417. The SBVs may be formed by depositing additional dielectric and conductive layers using any suitable process, including CMOS fabrication techniques. In some embodiments, one or more power/ground planes may be formed (as shown in FIG. 2) and the SBVs 417 provide vertical connections between the power/ground planes. In some embodiments, as shown in FIG. 7, only the first portion 410a may form a bridge 110 (e.g., no second portion 410b is formed).

Figure 4C:
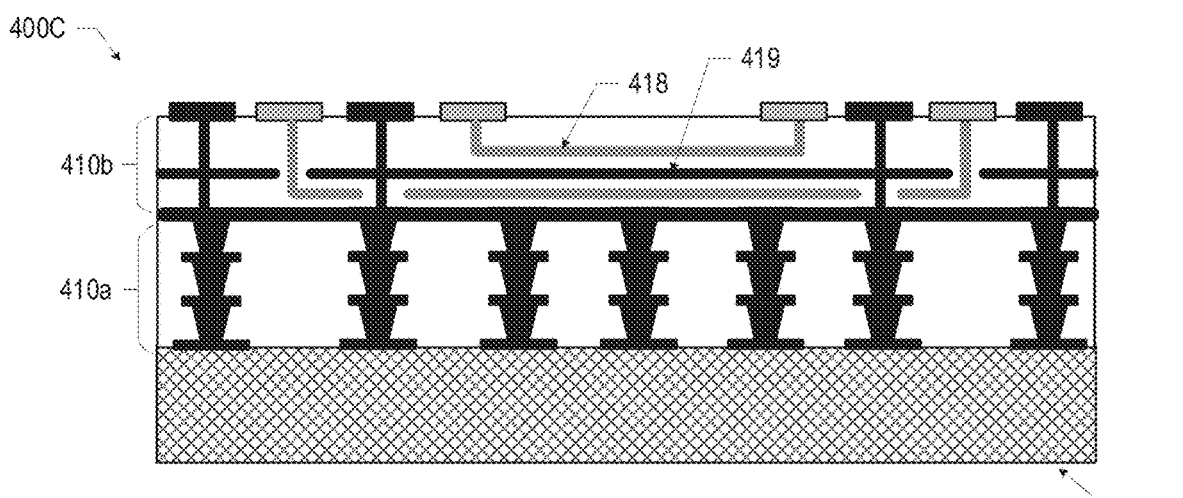

FIG. 4C illustrates an assembly 400C including the assembly 400B subsequent to forming a second portion 410b of the bridge on the first portion 410a. The second portion 410b may include conductive pathways 418, 419 through an insulating material, and may be formed using any suitable process, including CMOS fabrication techniques. In some embodiments, the first portion 410a of the bridge assembly may be formed using a different process from the second portion 410b of the bridge assembly. In some embodiments, the different processes may be used to form different input/output (I/O) densities and/or different conductive pathway dimensions in the first and second portions 110a, 110b. For example, in some embodiments, the dimensions of the conductive structures (e.g., 417) of the first portion 410a may be greater than the dimensions of the conductive structures (e.g., 418, 419, and vias) of the second portion 410b, as described above with reference to FIG. 1. In some embodiments, the first portion 410a may have a lesser I/O density as compared to the second portion 410b, also described above with reference to FIG. 1.

Figure 4D:
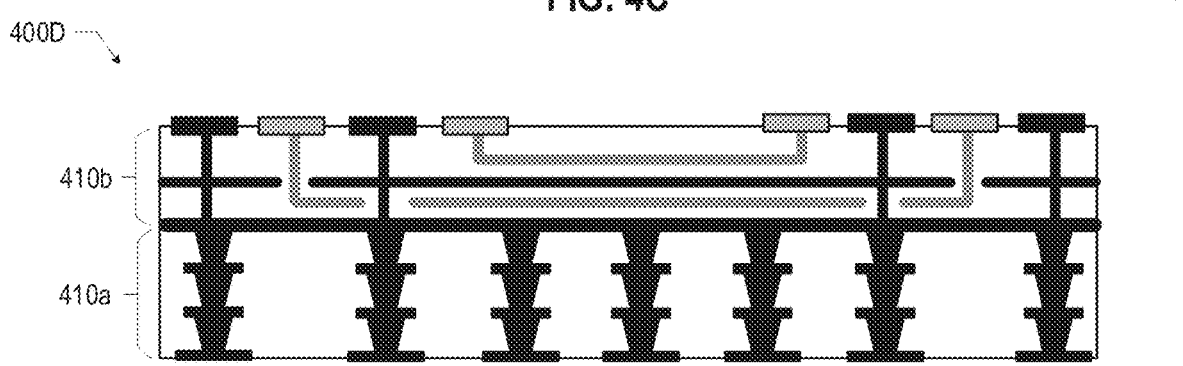

FIG. 4D illustrates an assembly 400D including the assembly 400C subsequent to removing the carrier 403. In some embodiments, the carrier removal process may include a wet etch, a dry etch (e.g., a plasma etch), a wet blast, or a laser ablation (e.g., by using excimer laser). In some embodiments, the carrier 403 may be attached using an adhesive or an ultraviolet (UV) active release film. The adhesive or UV release film may be deposited using any suitable process, including lamination, slit coating, spin coating, or spray coating, among others.

The finished assembly 400D may be a single unit or may be a repeating unit that may undergo a singulation process in which each unit is separated from one another to create a single bridge for embedding in a package substrate.

Figure 5:
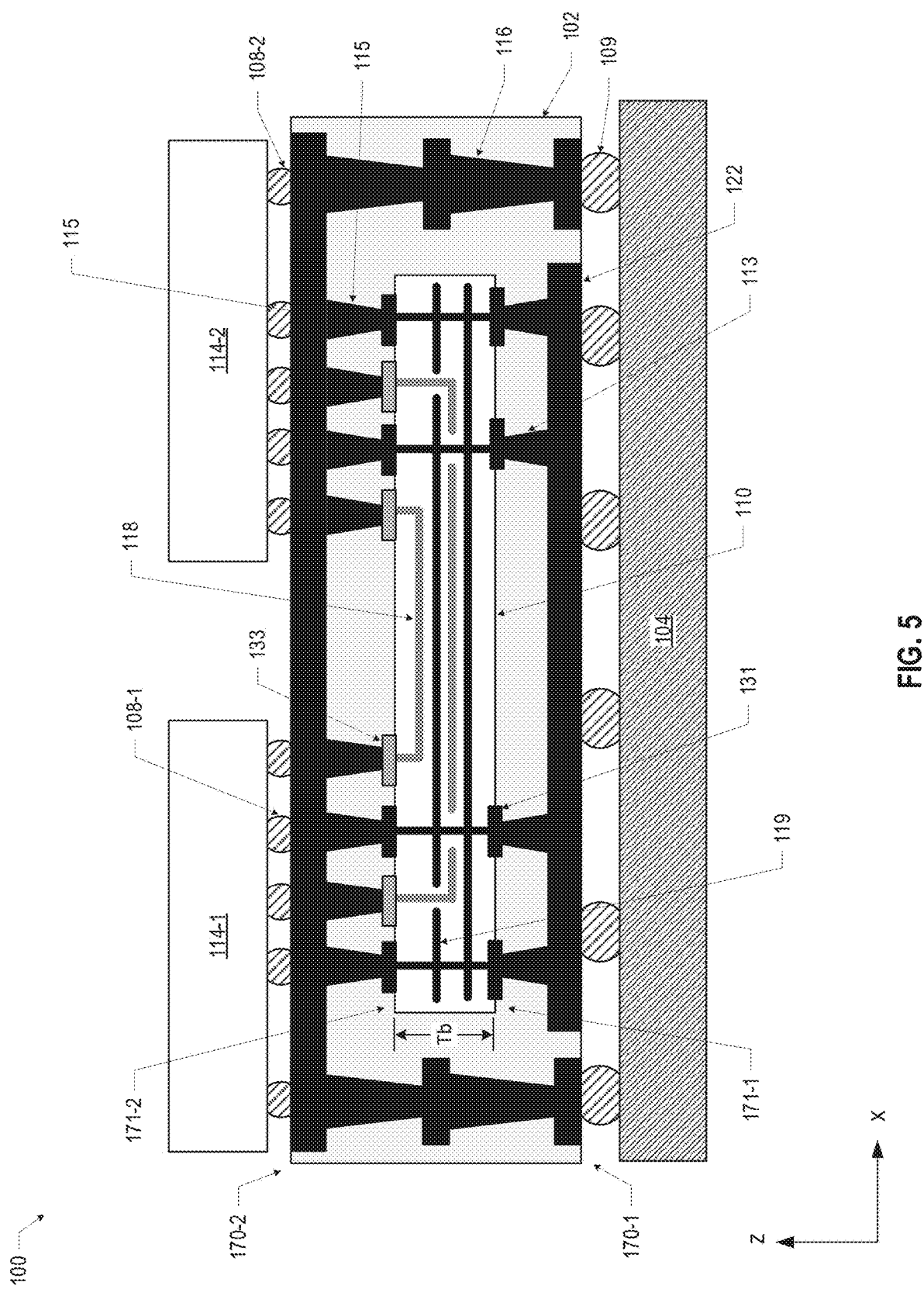
FIG. 5 is a side, cross-sectional view of an example microelectronic assembly, in accordance with various embodiments.

FIG. 5 is a cross-sectional side view of an example microelectronic assembly 100 including a package substrate 102, a bridge 110 embedded in the package substrate 102, and multiple dies 114 disposed thereon. As shown in FIG. 5, an x-dimension is width and a z-dimension is thickness. The package substrate 102 may have a first surface 170-1 and an opposing second surface 170-2. The bridge 110 may include a first surface 171-1 having first contacts 131 and a second surface 171-2 having second contacts 133, such that the bridge 110 is double-sided. For example, the bridge 110 may be coupled to the package substrate 102 at the first surface 171-1 via the first contacts 131 and at the second surface 171-2 via the second contacts 133. The bridge 110 may include high-density conductive pathways 118 (e.g., traces and/or vias) for routing electrical signals (e.g., the gray line features) between the dies 114-1, 114-2, and one or more ground and/or power planes 119 (e.g., planes and/or vias) for providing power (e.g., the black line features) to the dies 114-1, 114-2. As shown in FIG. 5, the bridge 110 may be a thinned bridge having a thickness (Tb) between 20 um and 50 um. The power/ground plane 119 may be coupled to a power/ground plane 122 in the package substrate 102 to provide vertical power delivery pathways from the package substrate 102 to the dies 114-1, 114-2. As shown in FIG. 5, the vertical power delivery pathways couple the power/ground plane 122 in the package substrate 102 to the power/ground plane 119 in the bridge 110 via the conductive pillars 113 and first contacts 131, and to the dies 114-1, 114-2 via the second contacts 133 and the conductive pillars 115. In some embodiments, the power/ground plane 122 in the package substrate 102 may be coupled to the first contacts 131 in the bridge 110 by a conductive adhesive, such as an anisotropic conductive film. Although FIG. 5 shows a particular arrangement of conductive structures (e.g., conductive pathways 118 and power/ground planes 119) in the bridge 110, a bridge 110 may have any suitable arrangement of conductive structures 118, 119, as desired.

Figure 6A:
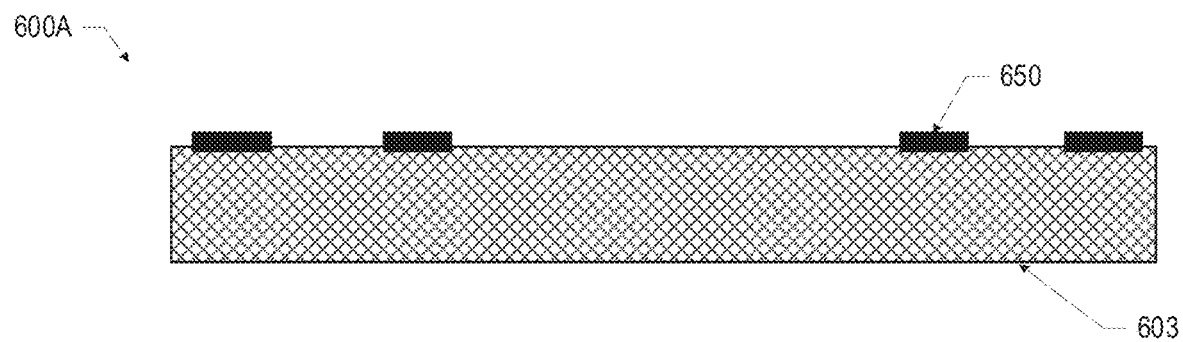
FIGS. 6A-6C are side, cross-sectional views of various stages in an example process for manufacturing a microelectronic assembly, in accordance with various embodiments.
Figure 6B:
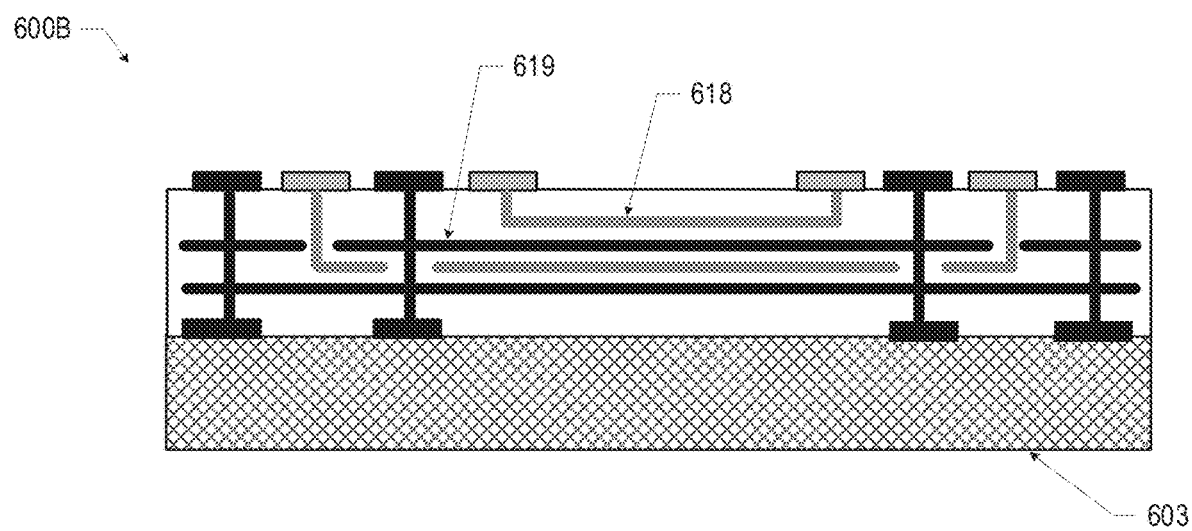
Figure 6C:

Any suitable techniques may be used to manufacture microelectronic assemblies having a double-sided, substrateless bridge disclosed herein. For example, FIGS. 6A-6C are side, cross-sectional views of various stages in an example process for manufacturing the bridge 110 of FIG. 5, in accordance with various embodiments. Although the operations discussed below with respect to FIGS. 6A-6C are illustrated in a particular order, these operations may be performed in any suitable order. Additionally, although particular assemblies are illustrated in FIGS. 6A-6C, the operations discussed below with reference to FIGS. 6A-6C may be used to form any bridge 110 disclosed herein.

FIG. 6A illustrates an assembly 600A including a carrier 603, also referred to herein as a substrate or silicon substrate, subsequent to depositing a first conductive layer 650 on the carrier 603. The first conductive layer 650 may be formed by depositing conductive material using any suitable technique, including CMOS fabrication techniques. The first conductive layer 650 may be any suitable conductive material, including copper or aluminum. The carrier 603 may be of any suitable material, such as silicon, and may be attached to the subassembly using any suitable means that may allow for removal at the end of the process.

FIG. 6B illustrates an assembly 600B including the assembly 600A subsequent to depositing additional dielectric and conductive layers to form conductive pathways 618, 619 through an insulating material. The additional dielectric and conductive layers may be formed using any suitable process, including CMOS fabrication techniques.

FIG. 6C illustrates an assembly 600C including the assembly 600B subsequent to removing the carrier 603. In some embodiments, the carrier removal process may include a wet etch, a dry etch (e.g., a plasma etch), a wet blast, or a laser ablation (e.g., by using excimer laser). In some embodiments, the carrier 603 may be attached using an adhesive or an ultraviolet (UV) active release film. The adhesive or UV release film may be deposited using any suitable process, including lamination, slit coating, spin coating, or spray coating, among others.

The finished assembly 600C may be a single unit or may be a repeating unit that may undergo a singulation process in which each unit is separated from one another to create a single bridge for embedding in a package substrate.

FIG. 7 is a cross-sectional side view of an example microelectronic assembly 100 including two stacked bridges 110 embedded in a package substrate 102, and multiple dies 114 disposed thereon. The bridges 110-1, 110-2 may be substrateless, double-sided bridges. The first bridge 110-1 may include a first surface 771-1 having first contacts 731-1 and a second surface 771-2 having second contacts 733-1. The first bridge 110-1 may include SBVs 117, and may further include one or more power/ground planes 219, as described above with reference to FIGS. 1-2. In some embodiments, the first bridge 110-1 may include a capacitor, as described above with reference to FIG. 3. The second bridge 110-2 may include a first surface 772-1 having first contacts 731-2 and a second surface 772-2 having second contacts 733-2. The second bridge 110-2 may include high-density conductive pathways 118 and one or more ground and/or power planes 119, as described above with reference to FIGS. 1 and 5. The first bridge 110-1 and the second bridge 110-2 may be stacked vertically, such that at least a part of the second bridge 110-2 overlaps at least a part of the first bridge 110-1. The first contacts 731-2 of the second bridge 110-2 may be coupled to the second contacts 733-1 of the first bridge 110-1 by conductive interconnects 750 to provide a vertical power delivery path between the package substrate 102 and the dies 114. The first bridge 110-1 may be coupled to the second bridge 110-2 using any suitable means, such as solder bumps (as shown), solder balls, or conductive adhesive, among others. A power/ground plane 122 in the package substrate 102 may be coupled to one or more dies 114 to provide vertical power pathways via the first bridge 110-1 and the second bridge 110-2.

The first and second bridges 110-1, 110-2 may be embedded in the package substrate 102 using any suitable technique. In some embodiments, the first bridge 110-1 may be coupled to the second bridge via the conductive interconnects 750 and subsequently embedded in the package substrate 102. In some embodiments, the first bridge 110-1 may be embedded in the package substrate 102, then the second bridge 110-2 may be coupled to the first bridge 110-1 via the conductive interconnects 750 and embedded in the package substrate 102. Although FIG. 7 shows a particular number and arrangement of bridges 110 and dies 114, a package substrate 102 may include any suitable number and arrangement of bridges 110 and dies 114.

The microelectronic assemblies disclosed herein may be included in any suitable electronic component. FIGS. 8-11 illustrate various examples of apparatuses that may include, or be included in, any of the microelectronic assemblies disclosed herein.

Figure 8:
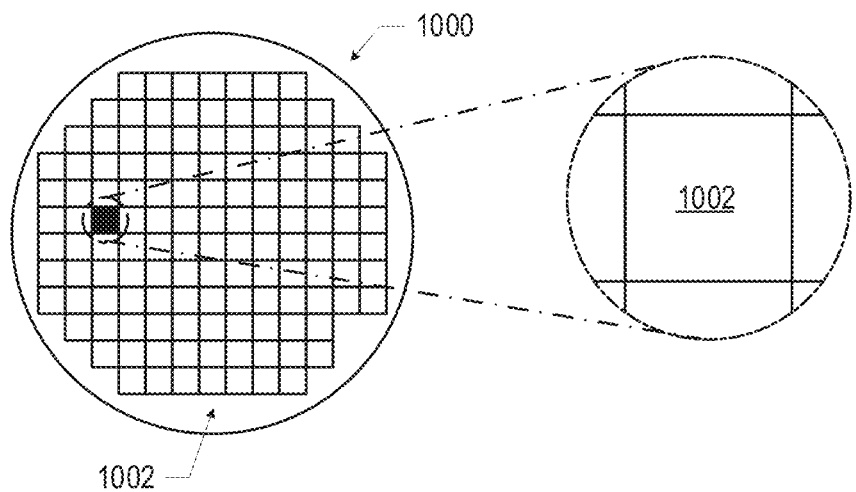
FIG. 8 is a top view of a wafer and dies that may be included in a microelectronic assembly, in accordance with any of the embodiments disclosed herein.

FIG. 8 is a top view of a wafer 1000 and dies 1002 that may be included in any of the microelectronic assemblies disclosed herein (e.g., any of the dies 114 disclosed herein). The wafer 1000 may be composed of semiconductor material and may include one or more dies 1002 having IC structures formed on a surface of the wafer 1000. Each of the dies 1002 may be a repeating unit of a semiconductor product that includes any suitable IC. After the fabrication of the semiconductor product is complete, the wafer 1000 may undergo a singulation process in which the dies 1002 are separated from one another to provide discrete "chips" of the semiconductor product. The die 1002 may be any of the dies 114 disclosed herein. The die 1002 may include one or more transistors (e.g., some of the transistors 1140 of FIG. 9, discussed below), supporting circuitry to route electrical signals to the transistors, passive components (e.g., signal traces, resistors, capacitors, or inductors), and/or any other IC components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device (e.g., the processing device 1402 of FIG. 11) or other logic that is configured to store information in the memory devices or execute instructions stored in the memory array. Various ones of the microelectronic assemblies disclosed herein may be manufactured using a die-to-wafer assembly technique in which some dies are attached to a wafer 1000 that includes others of the dies, and the wafer 1000 is subsequently singulated.

Figure 9:
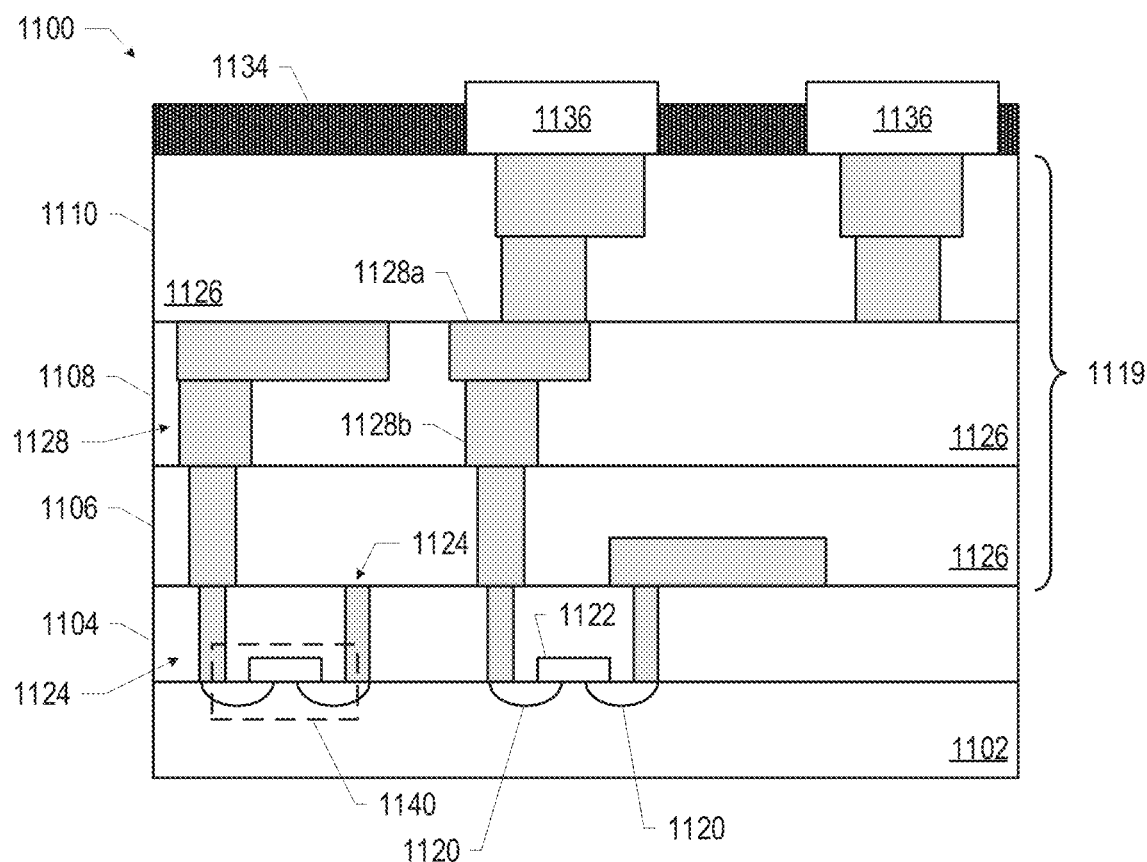
FIG. 9 is a cross-sectional side view of an integrated circuit device that may be included in a microelectronic assembly, in accordance with any of the embodiments disclosed herein.

FIG. 9 is a cross-sectional side view of an example IC device 1100 that may be included in any of the microelectronic assemblies disclosed herein (e.g., in any of the dies 114). One or more of the IC devices 1100 may be included in one or more dies 1002 (FIG. 8). The IC device 1100 may be formed on a substrate 1102 (e.g., the wafer 1000 of FIG. 8) and may be included in a die (e.g., the die 1002 of FIG. 8). The substrate 1102 may be a semiconductor substrate composed of semiconductor material systems including, for example, n-type or p-type materials systems (or a combination of both). The substrate 1102 may include, for example, a crystalline substrate formed using a bulk silicon or a silicon-on-insulator (SOI) substructure. In some embodiments, the substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1102. Although a few examples of materials from which the substrate 1102 may be formed are described here, any material that may serve as a foundation for an IC device 1100 may be used. The substrate 1102 may be part of a singulated die (e.g., the dies 1002 of FIG. 8) or a wafer (e.g., the wafer 1000 of FIG. 8).

The IC device 1100 may include one or more device layers 1104 disposed on the substrate 1102. The device layer 1104 may include features of one or more transistors 1140 (e.g., metal oxide semiconductor field-effect transistors (MOSFETs)) formed on the substrate 1102 and/or any other active and/or passive circuitry as may be desired by a device manufacturer. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 9 and may include a wide variety of other types and configurations such as, for example, planar transistors, non-planar transistors, or a combination of both. Non-planar transistors may include FinFET transistors, such as doublegate transistors or tri-gate transistors, and wrap-around or all-around gate transistors, such as nanoribbon and nanowire transistors.

Each transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the substrate 1102 adjacent to the gate 1122 of each transistor 1140. The S/D regions 1120 may be formed using an implantation/diffusion process or an etching/deposition process, for example. In the former process, dopants such as boron, aluminum, antimony, phosphorous, or arsenic may be ion-implanted into the substrate 1102 to form the S/D regions 1120. An annealing process that activates the dopants and causes them to diffuse farther into the substrate 1102 may follow the ion-implantation process. In the latter process, the substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or I/O signals, may be routed to and/or from the devices (e.g., transistors 1140) of the device layer 1104 through one or more interconnect layers disposed on the device layer 1104 (illustrated in FIG. 9 as interconnect layers 1106, 1108, and 1110). For example, electrically conductive features of the device layer 1104 (e.g., the gate 1122 and the S/D contacts 1124) may be electrically coupled with interconnect structures 1128 of the interconnect layers 1106-1110. The one or more interconnect layers 1106-1110 may form a metallization stack (also referred to as an "ILD stack") 1119 of the IC device 1100.

The interconnect structures 1128 may be arranged within the interconnect layers 1106-1110 to route electrical signals according to a wide variety of designs. In particular, the arrangement is not limited to the particular configuration of interconnect structures 1128 depicted in FIG. 9. For example, the interconnect structures may be arranged as multidirectional interconnect structures. Although a particular number of interconnect layers 1106-1110 is depicted in FIG. 9, embodiments of the present disclosure include IC devices having more or fewer interconnect layers than depicted.

In some embodiments, the interconnect structures 1128 may include lines 1128a and/or vias 1128b filled with an electrically conductive material such as a metal. The lines 1128a may be arranged to route electrical signals in a direction of a plane that is substantially parallel with a surface of the substrate 1102 upon which the device layer 1104 is formed. For example, the lines 1128a may route electrical signals in a direction in and out of the page from the perspective of FIG. 9. The vias 1128b may be arranged to route electrical signals in a direction of a plane that is substantially perpendicular to the surface of the substrate 1102 upon which the device layer 1104 is formed. In some embodiments, the vias 1128b may electrically couple lines 1128a of different interconnect layers 1106-1110 together.

The interconnect layers 1106-1110 may include a dielectric material 1126 disposed between the interconnect structures 1128, as shown in FIG. 9. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include lines 1128a and/or vias 1128b, as shown. The lines 1128a of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include vias 1128b to couple the lines 1128a of the second interconnect layer 1108 with the lines 1128a of the first interconnect layer 1106. Although the lines 1128a and the vias 1128b are structurally delineated with a line within each interconnect layer (e.g., within the second interconnect layer 1108) for the sake of clarity, the lines 1128a and the vias 1128b may be structurally and/or materially contiguous (e.g., simultaneously filled during a dual damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the IC device 1100 (i.e., farther away from the device layer 1104) may be thicker.

The IC device 1100 may include a solder resist material 1134 (e.g., polyimide or similar material) and one or more conductive contacts 1136 formed on the interconnect layers 1106-1110. In FIG. 9, the conductive contacts 1136 are illustrated as taking the form of bond pads. The conductive contacts 1136 may be electrically coupled with the interconnect structures 1128 and configured to route the electrical signals of the transistor(s) 1140 to other external devices. For example, solder bonds may be formed on the one or more conductive contacts 1136 to mechanically and/or electrically couple a chip including the IC device 1100 with another component (e.g., a circuit board). The IC device 1100 may include additional or alternate structures to route the electrical signals from the interconnect layers 1106-1110; for example, the conductive contacts 1136 may include other analogous features (e.g., posts) that route the electrical signals to external components.

In embodiments in which the IC device 1100 is a double-sided die, the IC device 1100 may include another metallization stack (not shown) on the opposite side of the device layer(s) 1104. This metallization stack may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the IC device 1100 from the conductive contacts 1136.

Figure 10:
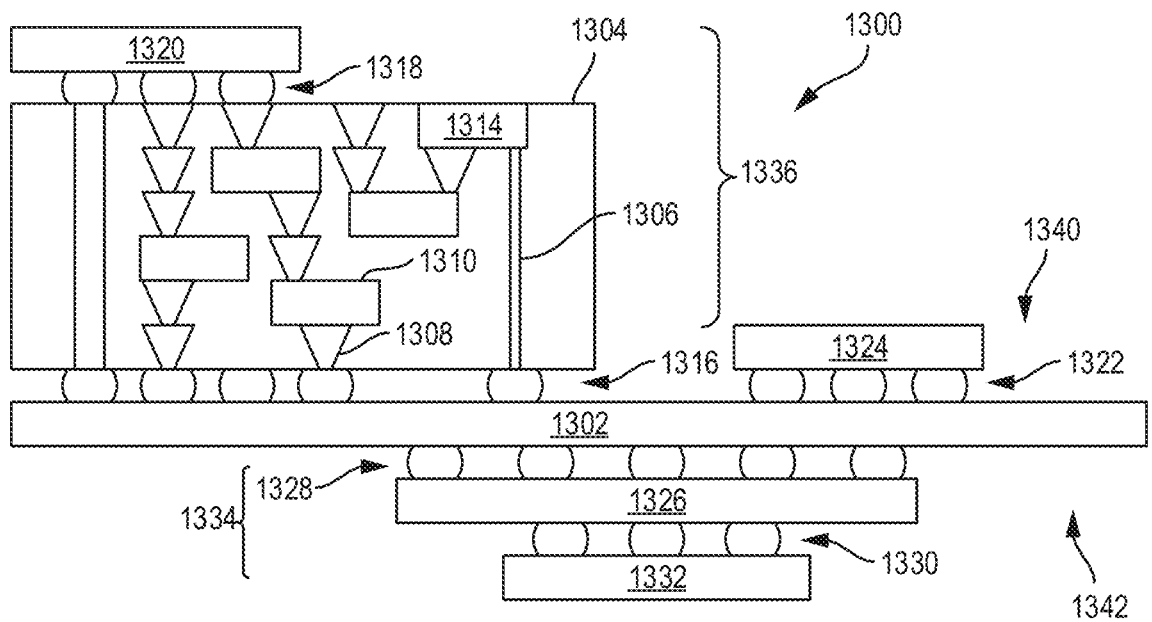
FIG. 10 is a cross-sectional side view of an integrated circuit device assembly that may include a microelectronic assembly, in accordance with any of the embodiments disclosed herein.

FIG. 10 is a cross-sectional side view of an IC device assembly 1300 that may include any of the microelectronic assemblies disclosed herein. In some embodiments, the IC device assembly 1300 may be a microelectronic assembly 100. The IC device assembly 1300 includes a number of components disposed on a circuit board 1302 (which may be, e.g., a motherboard). The IC device assembly 1300 includes components disposed on a first surface 1340 of the circuit board 1302 and an opposing second surface 1342 of the circuit board 1302; generally, components may be disposed on one or both surfaces 1340 and 1342. Any of the IC packages discussed below with reference to the IC device assembly 1300 may take the form of any suitable ones of the embodiments of the microelectronic assemblies disclosed herein.

In some embodiments, the circuit board 1302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 10 includes a package-on-interposer structure 1336 coupled to the first surface 1340 of the circuit board 1302 by coupling components 1316. The coupling components 1316 may electrically and mechanically couple the package-on-interposer structure 1336 to the circuit board 1302, and may include solder balls (as shown in FIG. 10), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 10, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1002 of FIG. 8), or any other suitable component. Generally, the interposer 1304 may spread a connection to a wider pitch or reroute a connection to a different connection. For example, the interposer 1304 may couple the IC package 1320 (e.g., a die) to a set of BGA conductive contacts of the coupling components 1316 for coupling to the circuit board 1302. In the embodiment illustrated in FIG. 10, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first surface 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 10 includes a package-on-package structure 1334 coupled to the second surface 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 11:
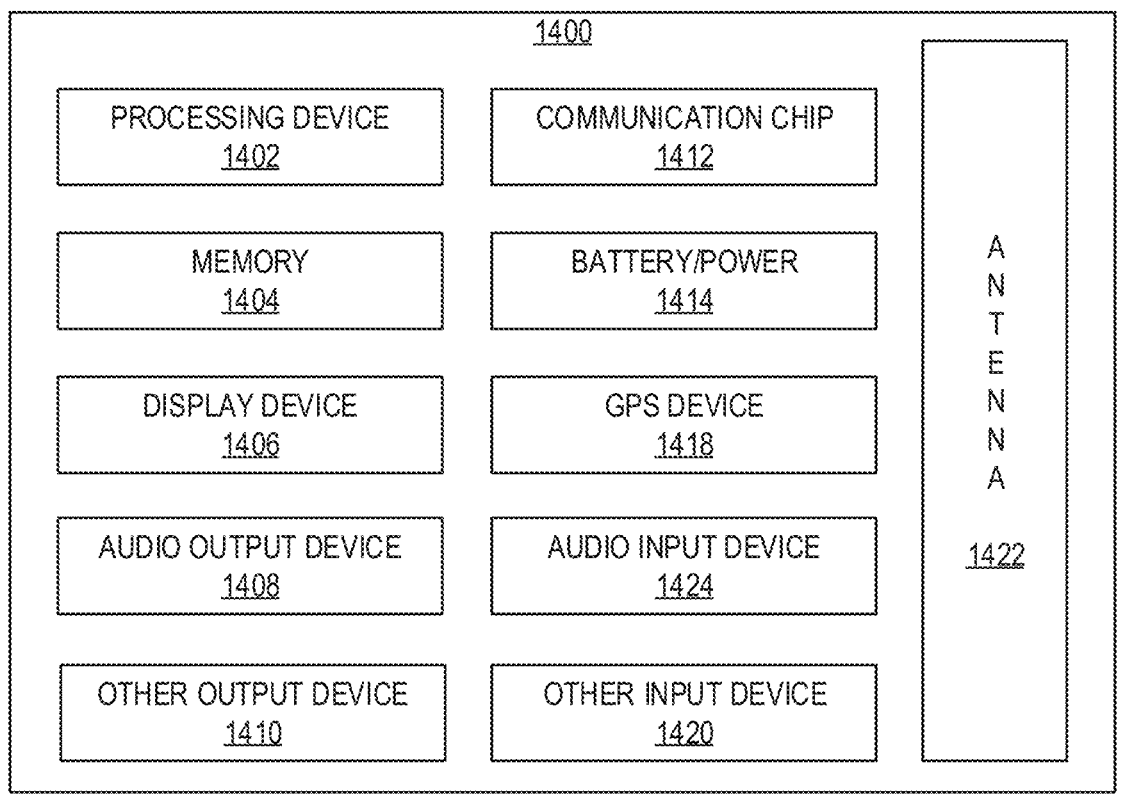
FIG. 11 is a block diagram of an example electrical device that may include a microelectronic assembly, in accordance with any of the embodiments disclosed herein.

FIG. 11 is a block diagram of an example electrical device 1400 that may include one or more of the microelectronic assemblies disclosed herein. For example, any suitable ones of the components of the electrical device 1400 may include one or more of the IC device assemblies 1300, IC devices 1100, or dies 1002 disclosed herein, and may be arranged in any of the microelectronic assemblies disclosed herein. A number of components are illustrated in FIG. 11 as included in the electrical device 1400, but any one or more of these components may be omitted or duplicated, as suitable for the application. In some embodiments, some or all of the components included in the electrical device 1400 may be attached to one or more motherboards. In some embodiments, some or all of these components are fabricated onto a single system-on-a-chip (SoC) die.

Additionally, in various embodiments, the electrical device 1400 may not include one or more of the components illustrated in FIG. 11, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), ASICs, CPUs, GPUs, cryptoprocessors (specialized processors that execute cryptographic algorithms within hardware), server processors, or any other suitable processing devices. The electrical device 1400 may include a memory 1404, which may itself include one or more memory devices such as volatile memory (e.g., dynamic random access memory (DRAM)), non-volatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-M RAM).

In some embodiments, the electrical device 1400 may include a communication chip 1412 (e.g., one or more communication chips). For example, the communication chip 1412 may be configured for managing wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, and 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as global positioning system (GPS), EDGE, GPRS, CDMA, WiMAX, LTE, EV-DO, or others. In some embodiments, a first communication chip 1412 may be dedicated to wireless communications, and a second communication chip 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any device that generates an audible indicator, such as speakers, headsets, or earbuds.

The electrical device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The electrical device 1400 may include a GPS device 1418 (or corresponding interface circuitry, as discussed above). The GPS device 1418 may be in communication with a satellite-based system and may receive a location of the electrical device 1400, as known in the art.

The electrical device 1400 may include another output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include another input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, or other portable computing device, etc.), a desktop electrical device, a server device or other networked computing component, a printer, a scanner, a monitor, a set-top box, an entertainment control unit, a vehicle control unit, a digital camera, a digital video recorder, or a wearable computing device. In some embodiments, the electrical device 1400 may be any other electronic device that processes data.

The following paragraphs provide various examples of the embodiments disclosed herein.

Example 1 is a microelectronic assembly, including: a substrate having a conductive plane; a first die; a second die; and a bridge, embedded in the substrate, having first contacts at a first surface and second contacts at an opposing second surface, the bridge including: a first conductive pathway coupling the first die to the second die; a second conductive pathway coupling the first die to the second die; and a plurality of vias arranged vertically and coupled to the second conductive pathway, wherein an individual via of the plurality of vias is coupled to an individual first contact, wherein the individual first contact is coupled to the conductive plane in the substrate, and wherein the first die and the second die are coupled to one or more of the second contacts at the second surface of the bridge.

Example 2 may include the subject matter of Example 1, and may further specify that an individual via of the plurality of vias has a thickness between 3 microns and 5 microns.

Example 3 may include the subject matter of Example 1, and may further specify that the first and second conductive pathways have a thickness between 0.5 microns and 2 microns.

Example 4 may include the subject matter of Example 1, and may further specify that the bridge further includes: a conductive plane between the plurality of vias and coupled to the plurality of vias.

Example 5 may include the subject matter of Example 4, and may further specify that the conductive plane in the bridge has a thickness between 2 microns and 5 microns.

Example 6 may include the subject matter of Example 4, and may further specify that the conductive plane in the bridge is a first conductive plane, and wherein the bridge further includes: a second conductive plane; and a capacitor between the first conductive plane and the second conductive plane.

Example 7 may include the subject matter of Example 6, and may further specify that the capacitor is a metal-insulator-metal (MIM) capacitor.

Example 8 may include the subject matter of Example 1, and may further specify that the bridge does not include a silicon substrate.

Example 9 may include the subject matter of Example 1, and may further specify that the bridge includes one or more of silicon dioxide, silicon nitride, oxynitride, organo-silicate glass (OSG), and silicon oxycarbide (SiOC).

Example 10 may include the subject matter of Example 1, and may further specify that the individual first contact is coupled to the conductive plane in the substrate by conductive adhesive.

Example 11 may include the subject matter of Example 1, and may further specify that the individual first contact is coupled to the conductive plane in the substrate by a conductive pillar or a solder joint.

Example 12 may include the subject matter of Example 1, and may further specify that the one or more second contacts are coupled to the first die by solder.

Example 13 may include the subject matter of Example 1, and may further specify that the one or more second contacts are coupled to the first die by a conductive pillar.

Example 14 may include the subject matter of Example 1, and may further specify that the conductive plane in the substrate is coupled to a power source.

Example 15 may include the subject matter of Example 1, and may further specify that the conductive plane in the substrate is coupled to a ground source.

Example 16 may include the subject matter of Example 1, and may further specify that the first conductive pathway is for routing signals between the first die and the second die.

Example 17 may include the subject matter of Example 1, and may further specify that the second conductive pathway is for delivering power to the first die and to the second die.

Example 18 is a computing device, including: a circuit board; and an integrated circuit (IC) package disposed on the circuit board, wherein the IC package includes: a package substrate having a conductive plane; a bridge having a plurality of first contacts at a first surface, a plurality of second contacts at an opposing second surface, and a conductive pathway including a plurality of vertically stacked vias between an individual first contact and an individual second contact, wherein the bridge is embedded in the package substrate and coupled to the conductive plane in the package substrate via the individual first contact; and a die coupled to the individual second contact at the second surface of the bridge and coupled to the conductive plane in the package substrate by the plurality of vertically stacked vias.

Example 19 may include the subject matter of Example 18, and may further specify that an individual via of the plurality of stacked vias has a thickness between 3 microns and 5 microns.

Example 20 may include the subject matter of Example 18, and may further specify that the die is a first die and the conductive pathway is a first conductive pathway, and the computing device further includes: a second die coupled to the second surface of the bridge and coupled to the first die by a second conductive pathway in the bridge.

Example 21 may include the subject matter of Example 20, and may further specify that the second conductive pathway has a thickness between 0.5 microns and 2 microns.

Example 22 may include the subject matter of Example 20, and may further specify that the bridge does not include a silicon substrate.

Example 23 may include the subject matter of Example 20, and may further specify that the bridge includes one or more of silicon dioxide, silicon nitride, oxynitride, organosilicate glass (OSG), and silicon oxycarbide (SiOC).

Example 24 may include the subject matter of Example 18, and may further specify that the conductive plane in the package substrate is coupled to a power source.

Example 25 may include the subject matter of Example 18, and may further specify that the conductive plane in the package substrate is coupled to a ground source.

Example 26 may include the subject matter of Example 20, and may further specify that the first die is a central processing unit and the second die is a graphics processing unit.

Example 27 may include the subject matter of Example 20, and may further specify that the first die is a central processing unit and the second die is memory.

Example 28 may include the subject matter of any of Examples 18-27, and may further specify that the computing device is a server device.

Example 29 may include the subject matter of any of Examples 18-27, and may further specify that the computing device is a portable computing device.

Example 30 may include the subject matter of any of Examples 18-27, and may further specify that the computing device is a wearable computing device.

Example 31. An integrated circuit (IC) package, including: a package substrate having a conductive plane; a first die; a second die; and a bridge having first contacts on a first surface and second contacts on an opposing second surface, wherein the bridge is embedded in the package substrate, wherein the bridge is coupled to the conductive plane in the package substrate via the first contacts, wherein the first die and the second die are coupled to the bridge via the second contacts, wherein the bridge does not include a silicon substrate, and wherein the bridge includes: a first conductive pathway coupling the first die to the second die; and a second conductive pathway coupled to a conductive plane in the bridge, wherein the second conductive pathway includes a linear, vertical pathway between an individual first contact and an individual second contact.

Example 32 may include the subject matter of Example 31, and may further specify that the bridge is a first bridge, and the IC package further includes: a second bridge having third contacts on a first surface and fourth contacts on an opposing second surface, wherein the second bridge is embedded in the package substrate beneath the first bridge, wherein the second bridge is coupled to the conductive plane in the package substrate via the third contacts, and wherein the second bridge includes a plurality of vertically stacked vias between an individual third contact and an individual fourth contact of the second bridge, and wherein the individual fourth contact on the second bridge is coupled to the individual first contact on the first bridge.

Example 33 may include the subject matter of Example 32, and may further specify that the second bridge further includes: a conductive plane between the plurality of vertically stacked vias.

Example 34 may include the subject matter of Example 31, and may further specify that a thickness of the first conductive pathway is between 0.5 microns and 2 microns.

Example 35 may include the subject matter of Example 32, and may further specify that a thickness of an individual via of the plurality of vertically stacked vias is between 3 microns and 5 microns.

Example 36 may include the subject matter of Example 33, and may further specify that a thickness of the conductive plane in the second bridge is between 2 microns and 5 microns.

Example 37 may include the subject matter of Example 32, and may further specify that the first bridge is coupled to the second bridge by solder.

Example 38 may include the subject matter of Example 32, and may further specify that the first bridge is coupled to the second bridge by a conductive adhesive.

Example 39 may include the subject matter of Example 31, and may further specify that the conductive plane in the package substrate is coupled to a power source.

Example 40 may include the subject matter of Example 31, and may further specify that the conductive plane in the package substrate is coupled to a ground source.

Example 41 may include the subject matter of Example 31, and may further specify that the first conductive pathway is for routing signals between the first die and the second die.

Example 42 may include the subject matter of Example 31, and may further specify that the second conductive pathway is for delivering power to the first die.

The invention claimed is:

1. A microelectronic assembly, comprising:
   a substrate having a conductive plane at an outermost surface of the substrate;
   a first die;
   a second die; and a bridge, embedded in the substrate above the conductive plane of the substrate, wherein the conductive plane is continuous along an entire width of the bridge, the bridge having first contacts at a first surface of the bridge and second contacts at an opposing second surface of the bridge, the first surface below the second surface, the bridge comprising:
a first conductive pathway coupling the first die to the second die; a second conductive pathway coupling the first die to the second die, the second conductive pathway below the first conductive pathway; and
a plurality of vias arranged vertically and coupled to the second conductive pathway, the plurality of vias below the second conductive pathway, wherein each via of the plurality of vias vertically overlaps with an individual first contact of the first contacts, wherein an individual via of the plurality of vias is coupled to the individual first contact, wherein the individual first contact is coupled to the conductive plane in the substrate, and wherein the first die and the second die are coupled to one or more of the second contacts at the second surface of the bridge.

2. The microelectronic assembly of claim 1, wherein the bridge further includes:
a conductive plane between the plurality of vias and coupled to the plurality of vias.

3. The microelectronic assembly of claim 2, wherein the conductive plane in the bridge is a first conductive plane, and wherein the bridge further includes: a second conductive plane; and a capacitor between the first conductive plane and the second conductive plane.

4. The microelectronic assembly of claim 3, wherein the capacitor is a metal-insulator-metal (MIM) capacitor.

5. The microelectronic assembly of claim 1, wherein the bridge does not include a silicon substrate.

6. The microelectronic assembly of claim 1, wherein the bridge includes one or more of silicon dioxide, silicon nitride, oxynitride, organo-silicate glass (OSG), and silicon oxycarbide (SiOC).

7. The microelectronic assembly of claim 1, wherein the individual first contact is coupled to the conductive plane in the substrate by a conductive pillar or a solder joint.

8. The microelectronic assembly of claim 1, wherein the one or more second contacts are coupled to the first die by solder or a conductive pillar.

9. A computing device, comprising:
a circuit board; and
an integrated circuit (IC) package disposed on the circuit board, wherein the IC package includes:
a package substrate having a conductive plane at an outermost surface of the substrate;
a bridge above the conductive plane of the package substrate, wherein the conductive plane is continuous along an entire width of the bridge, the bridge having a plurality of first contacts at a first surface of the bridge, the first surface below the second surface, a plurality of second contacts at an opposing second surface of the bridge, and a conductive pathway above a plurality of vertically stacked vias and coupling a first die and a second die, the conductive pathway and the plurality of vertically stacked vias between an individual first contact of the plurality of first contacts and an individual contact second contact of the plurality of second contacts, wherein each via of the plurality of vertically stacked vias vertically overlaps with the individual first contact, wherein the bridge is embedded in the package substrate and coupled to the conductive plane in the package substrate via the individual first contact; and
one of the first die and the second die is coupled to the individual second contact at the second surface of the bridge and coupled to the conductive plane in the package substrate by the plurality of vertically stacked vias.

10. The computing device of claim 9, wherein the conductive pathway is a first conductive pathway, and the computing device further comprises:
the other of the first die and the second die is coupled to the second surface of the bridge by another second contact of the plurality of second contacts and coupled to the first die by a second conductive pathway in the bridge.

11. The computing device of claim 9, wherein the bridge does not include a silicon substrate.

12. The computing device of claim 9, wherein the bridge includes one or more of silicon dioxide, silicon nitride, oxynitride, organo-silicate glass (OSG), and silicon oxycarbide (SiOC).

13. The computing device of claim 9, wherein the conductive plane in the package substrate is coupled to a power source.

14. The computing device of claim 9, wherein the conductive plane in the package substrate is coupled to a ground source.

15. The computing device of claim 9, wherein the computing device is a wearable computing device.

16. An integrated circuit (IC) package, comprising:
a package substrate having a conductive plane at an outermost surface of the substrate;
a first die;
a second die; and
a bridge above the conductive plane of the package substrate, wherein the conductive plane is continuous along an entire width of the bridge, the bridge having first contacts on a first surface of the bridge and second contacts on an opposing second surface of the bridge, the first surface below the second surface, wherein the bridge is embedded in the package substrate, wherein the bridge is coupled to the conductive plane in the package substrate via the first contacts, wherein the first die and the second die are coupled to the bridge via the second contacts, wherein the bridge does not include a silicon substrate, and wherein the bridge includes:
a first conductive pathway coupling the first die to the second die; and
a second conductive pathway coupled to a conductive plane in the bridge, the second conductive pathway below the first conductive pathway, wherein the second conductive pathway is above a plurality of vertically stacked conductive vias, wherein the plurality of vertically stacked conductive vias vertically overlaps with the individual first contact.

17. The IC package of claim 16, wherein the bridge is a first bridge, and the IC package further comprises: a second bridge having third contacts on a first surface of the second bridge and fourth contacts on an opposing second surface of the second bridge, wherein the second bridge is embedded in the package substrate beneath the first bridge, wherein the second bridge is coupled to the conductive plane in the package substrate via the third contacts, and wherein the second bridge includes the plurality of vertically stacked conductive vias between an individual third contact of the third contacts and an individual fourth contact of the fourth contacts, and wherein the individual fourth contact is coupled to the individual first contact.

18. The IC package of claim 17, wherein the second bridge further comprises: a conductive plane between the plurality of vertically stacked conductive vias.

19. The IC package of claim 17, wherein the first bridge is coupled to the second bridge by solder.

20. The IC package of claim 17, wherein the first bridge is coupled to the second bridge by a conductive adhesive.

* * * * *